(12) United States Patent
Haneda et al.

(10) Patent No.: US 7,266,139 B2
(45) Date of Patent: Sep. 4, 2007

(54) OPTICAL SEMICONDUCTOR DEVICE MODULE AND BIDIRECTIONAL MODULE

(75) Inventors: Hideki Haneda, Tokyo (JP); Seiichiro Tabata, Tokyo (JP); Atsushi Kawamura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 247 days.

(21) Appl. No.: 11/119,909

(22) Filed: May 3, 2005

(65) Prior Publication Data

US 2005/0276304 A1   Dec. 15, 2005

(30) Foreign Application Priority Data

Jun. 9, 2004   (JP) ............................. 2004-171587

(51) Int. Cl.
*H01S 3/08* (2006.01)
(52) U.S. Cl. ................. 372/101; 372/107; 372/108
(58) Field of Classification Search ................. 372/101
See application file for complete search history.

(56) References Cited

U.S. PATENT DOCUMENTS

| | | | |
|---|---|---|---|
| 5,638,475 A | 6/1997 | Gaebe | |
| 5,911,021 A | 6/1999 | MacDonald et al. | |
| 6,010,251 A * | 1/2000 | Koyanagi et al. | 385/93 |
| 6,558,048 B2 * | 5/2003 | Kuhara et al. | 385/93 |
| 2004/0119988 A1 * | 6/2004 | Chen et al. | 356/615 |

FOREIGN PATENT DOCUMENTS

| JP | 8-130320 | | 5/1996 |
|---|---|---|---|
| JP | 08-130320 | * | 5/1996 |

* cited by examiner

*Primary Examiner*—Armando Rodriguez
(74) *Attorney, Agent, or Firm*—Leydig, Voit & Mayer, Ltd.

(57) ABSTRACT

A semiconductor laser diode optically coupled to an optical fiber is mounted on a stem. A cap having a light transmissive hole between the optical fiber and the semiconductor laser diode is fixed to the stem. A ball lens is fixed in the light transmissive hole. The ball lens has a refractive index of 1.9 or more and a diameter between 1.5 mm and 2.5 mm.

8 Claims, 10 Drawing Sheets

OPTICAL SEMICONDUCTOR DEVICE MODULE AND BIDIRECTIONAL MODULE

BACKGROUND OF THE INVENTION

1. Field of the Invention

The present invention relates to an optical semiconductor device module and bidirectional module, used for a semiconductor laser, a semiconductor photodiode, or a semiconductor optical modulator.

2. Background Art

A conventional optical semiconductor device module is configured such that: a ball lens is held by a cap having a light transmissive hole; and the light emitted from the semiconductor device mounted on a stem is converged by the ball lens and then coupled to the optical fiber.

For example, when the ball lens is formed of BK-7 (borosilicate glass) and has a refractive index of 1.5 and a diameter of 1.5 mm, if the distance from the end face of the semiconductor device to (the center of) the light entrance surface of the ball lens is 0.83 mm, the distance from the stem to the focal point of the exiting light is 6.5 mm. In this case, the optical coupling efficiency to single-mode fiber having a mode diameter of 10 μm is approximately 16%.

Further, when the ball lens is formed of $TaF_3$ (dense lanthanum flint glass) and has a refractive index of 1.78 and a diameter of 2.0 mm, if the distance from the end face of the semiconductor device to (the center of) the light entrance surface of the ball lens is 0.53 mm, the distance from the stem to the focal point of the exiting light is 6.6 mm. In this case, the optical coupling efficiency to single-mode fiber having a mode diameter of 10 μm is approximately 20%.

Further, Japanese Laid-Open Patent Publication No. 8-130320 (1996) discloses an optical system which achieves a coupling efficiency of 30% or more by using a ball lens 0.6 mm-1.4 mm in diameter having a refractive index of 1.9.

With these conventional optical semiconductor device modules, however, if the assembling accuracy of the semiconductor device or the ball lens is degraded to approximately ±50 μm or worse, the optical coupling efficiency to the optical fiber significantly drops. To prevent this from happening, it is necessary to adjust the installation position of the optical fiber according to the angle of the light emitted from the semiconductor device or to employ an aspherical lens or a plurality of lenses, which has been an obstacle to cost reduction.

SUMMARY OF THE INVENTION

The present invention has been devised in view of the above problems. It is, therefore, an object of the present invention to provide an optical semiconductor device module and bidirectional module, capable of providing high coupling efficiency at low cost even when the assembling accuracy of the semiconductor device or the ball lens is degraded.

According to one aspect of the present invention, an optical semiconductor device module comprises an optical semiconductor device for optically coupling to an optical fiber, a stem for mounting the optical semiconductor device, a cap fixed to the stem, the cap having a light transmissive hole between the optical fiber and the optical semiconductor device, and a ball lens fixed in the light transmissive hole. The ball lens has a refractive index of 1.9 or more and a diameter between 1.5 mm and 2.5 mm.

According to another aspect of the present invention, a bidirectional module comprises a semiconductor laser diode for emitting light, a semiconductor photodiode for receiving the light emitted by the semiconductor laser diode, an optical fiber to which the semiconductor laser diode and the semiconductor diode are optically coupled, a stem for mounting the semiconductor laser diode, a cap fixed to the stem, the cap having a light transmissive hole between the optical fiber and the semiconductor laser diode, and a ball lens fixed in the light transmissive hole. An end face of the optical fiber is at an angle between 4 degrees and 20 degrees relative to a direction perpendicular to the central axis of the optical fiber. The ball lens has a refractive index of 1.9 or more and a diameter between 1.5 mm and 2.5 mm.

Other objects and advantages of the present invention will become apparent from the following description.

BRIEF DESCRIPTION OF THE DRAWINGS

FIG. 2 shows how coupling efficiencies change with the distance a.

DETAILED DESCRIPTION OF THE PREFERRED EMBODIMENTS

The optical semiconductor device module of the present embodiment is characterized in that it employs a ball lens having a refractive index of 1.9 or more and a diameter between 1.5 mm and 2.5 mm.

Figure 1:
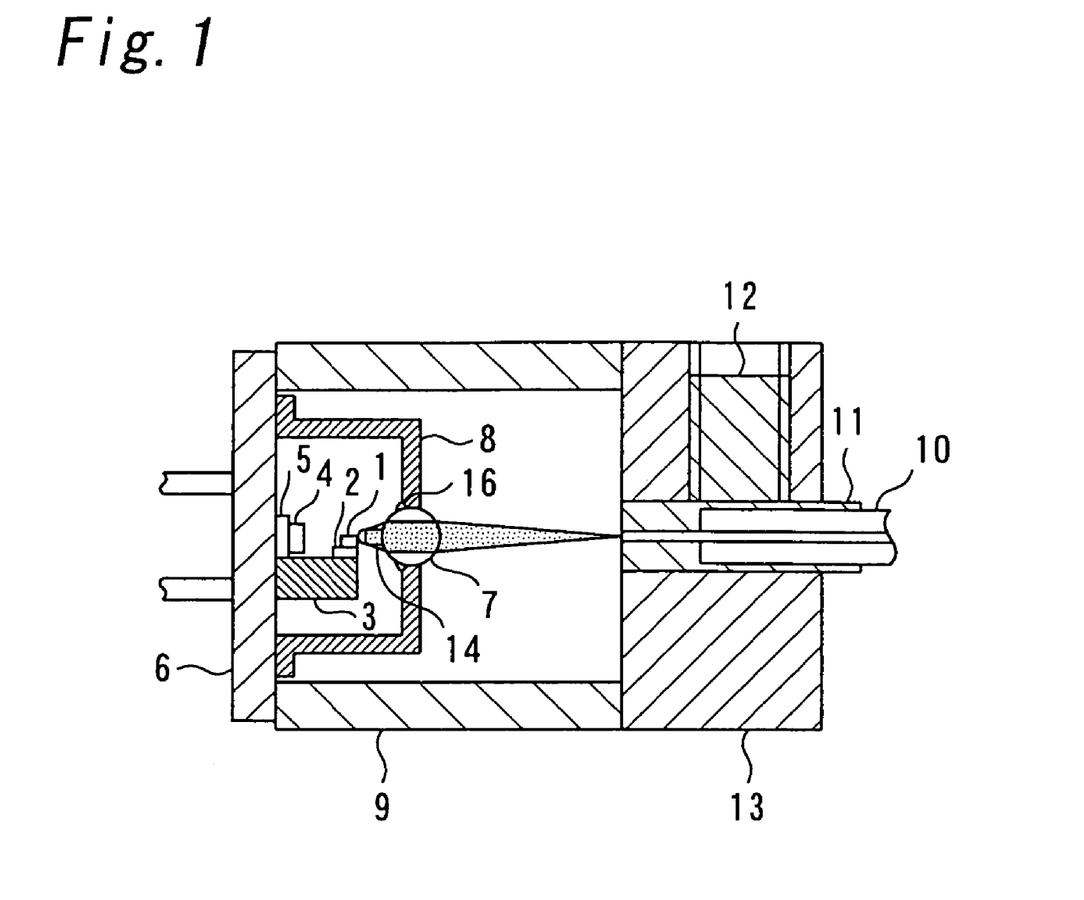
FIG. 1 is a cross-sectional view of an optical semiconductor device module according to the present invention.

FIG. 1 is a cross-sectional view of the optical semiconductor device module of the present embodiment. It should be noted that there are two types of optical semiconductor device modules: those designed to efficiently couple the light emitted from a semiconductor laser diode to the optical fiber, and those designed to couple the light exiting the optical fiber to a semiconductor photodiode. The present invention is especially effective when applied to optical semiconductor device modules employing a semiconductor laser diode. However, it can be applied to optical semiconductor device modules employing a semiconductor photodiode. These two types of optical semiconductor device modules have substantially the same configuration though they employ different optical semiconductor devices. FIG. 1 shows an optical semiconductor device module including a semiconductor laser diode.

Referring to FIG. 1, a semiconductor laser diode 1 (an optical semiconductor device) is fixed to a plated iron stem 6 through a first mount 2 and a heat sink 3. Further, a semiconductor photodiode 4 is also fixed to the stem 6 through a second mount 5. The stem 6, in turn, is fixed to a first chassis 9 by YAG laser welding or projection welding. It should be noted that the semiconductor laser diode 1 may be a Fabry-Perot semiconductor laser diode or a distributed feedback semiconductor laser diode emitting light having a wavelength in the range of 1.3μ-1.55 μm.

The semiconductor laser diode 1 and the semiconductor photodiode 4 are sealed by use of a cap 8 projection-welded to the stem 6. A ball lens 7 is fixed in the light transmissive hole of the cap 8 by use of low melting point glass 16. The present embodiment is characterized in that the ball lens 7 has a refractive index of 1.9 or more and a diameter between 1.5 mm and 2.5 mm. It should be noted that the refractive index of the ball lens 7 is preferably between 1.9 and 3.8, assuming that the ball lens 7 is formed of a common material.

It should be noted that by increasing its diameter, a ball lens having a higher refractive index can provide substantially the same refractive power as a ball lens having a lower refractive index. According to the present embodiment, the refractive index of the ball lens is set to 1.9 or more to prevent occurrence of spherical aberration and thereby increase the amount of light coupled to the core of the optical fiber, allowing the coupling efficiency to the optical fiber to be increased.

Further, a ball lens having a larger diameter tolerates a lower mounting accuracy than a ball lens having a smaller diameter even though it has a lower coupling efficiency to the optical fiber, as described below.

The coupling efficiency of light to an optical fiber is maximized when the light enters the optical fiber at an angle determined by the Snell's law from the angle of the end face of the optical fiber with respect to the light (this coupling efficiency is hereinafter referred to as the maximum coupling efficiency). The coupling efficiency of the light gradually decreases as the angle of the light deviates from the ideal angle. On the other hand, the focal distance f of a ball lens increases with increasing diameter of the lens. Therefore, if the distance Df from the top surface of the stem 6 to the focal point is to be kept constant, the distance from the center of the ball lens to the semiconductor laser diode must be increased as the diameter of the lens is increased. This means that a ball lens having a larger diameter exhibits a smaller variation in the angle of the exiting light than a ball lens having a smaller diameter when these ball lenses are displaced from their proper position relative to the semiconductor laser diode. Therefore, to obtain a given coupling efficiency, the ball lens having a larger diameter tolerates lower mounting accuracy.

On the other hand, the maximum coupling efficiency is determined by the magnitudes of the lateral magnification and the spherical aberration of the optical system. When the mode field diameters of the single-mode optical fiber and the semiconductor laser diode are 10 μm and approximately 2 μm, respectively, the lateral magnification is preferably approximately 5 (=10/2). As described above, the focal distance f of a ball lens increases with increasing diameter of the lens. Therefore, if the distance Df from the top surface of the stem 6 to the focal point is to be kept constant, the lateral magnification must be reduced as the diameter of the lens is increased. It should be noted that the lateral magnification (m) is expressed by the ratio of the distance from the optical fiber to the center of the ball lens to the distance from the semiconductor laser diode to the center of the ball lens. For example, when the distance Df is 6.35 mm and the distance from the top surface of the stem 6 to the light emission point of the semiconductor laser diode is 1.27 mm, if the ball lens has a refractive index of 1.97 and a diameter of 1.5 mm, then the lateral magnification m is 3.49. If the ball lens has a refractive index of 1.97 and a diameter of 2.0 mm, then the later magnification m is 2.75. Therefore, in this case, the ball lens having a diameter of 1.5 mm is more advantageous than the ball lens having a diameter of 2.0 mm in terms of maximum coupling efficiency since the former provides a lateral magnification closer to the ideal value 5.

On the other hand, the spherical aberration is related to the distance a between the semiconductor laser diode and the center of the light entrance surface of the ball lens; the aberration tends to decrease as this distance decreases. For example, when the distance Df is 6.35 mm, if the ball lens has a refractive index of 1.97 and a diameter of 1.5, then the distance a is 0.23 mm. If the ball lens has a refractive index of 1.97 and a diameter of 2.0, then the distance a is 0.385 mm. In this case, the numerical aperture (NA) corresponding to the ball lens radius 0.75 mm is larger than that corresponding to the ball lens radius 1.0 mm. Therefore, the ball lens having a diameter of 1.5 mm exhibits a smaller spherical aberration than the ball lens having a diameter of 2.0 mm. That is, the former is more advantageous than the latter in terms of maximum coupling efficiency (as in the terms of the lateral magnification m).

Figure 2:
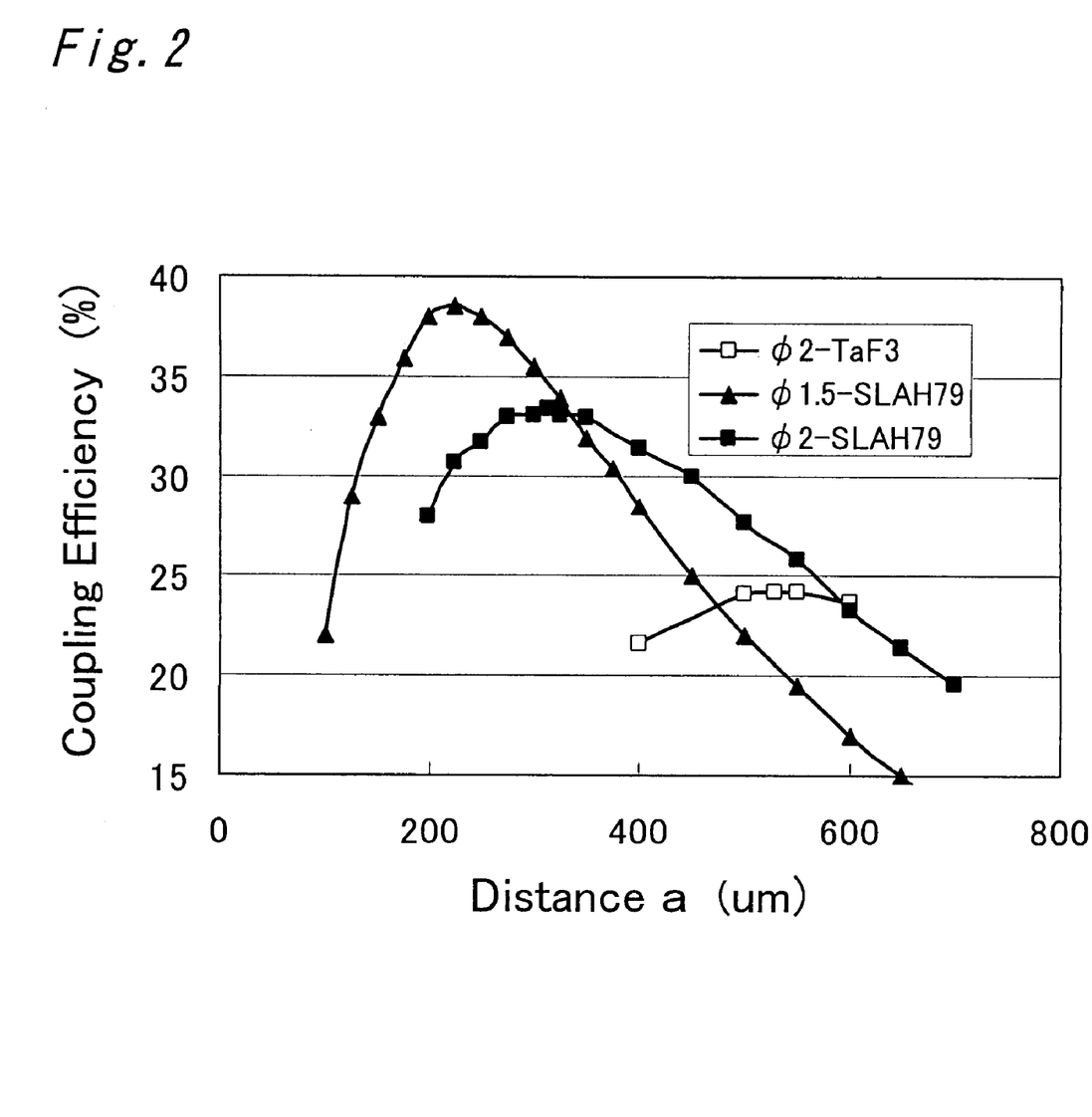

FIG. 2 shows how coupling efficiencies change with the distance a. The figure indicates that a ball lens having a diameter of 1.5 mm exhibits a higher coupling efficiency than a ball lens having a diameter of 2.0 mm if they are formed of S-LAH79. It also indicates that a ball lens formed of S-LAH79 (having a refractive index of 1.97) exhibits a higher coupling efficiency than a ball lens formed of $TaF_3$ (having a refractive index of 1.78) if they have the same diameter. It should be noted that S-LAH79 and $TaF_3$ are types of dense lanthanum flint glass.

Thus, the smaller the diameter of the ball lens, the better in terms of maximum coupling efficiency. However, reducing the diameter of the ball lens requires reducing the distance from the semiconductor laser diode to the center of the ball lens. This means that a ball lens having a smaller diameter exhibits a larger variation in the angle of the exiting light than a ball lens having a larger diameter when these ball lenses are displaced from their proper position relative to the semiconductor laser diode. Therefore, the ball having a smaller diameter requires higher mounting accuracy.

Figure 3:
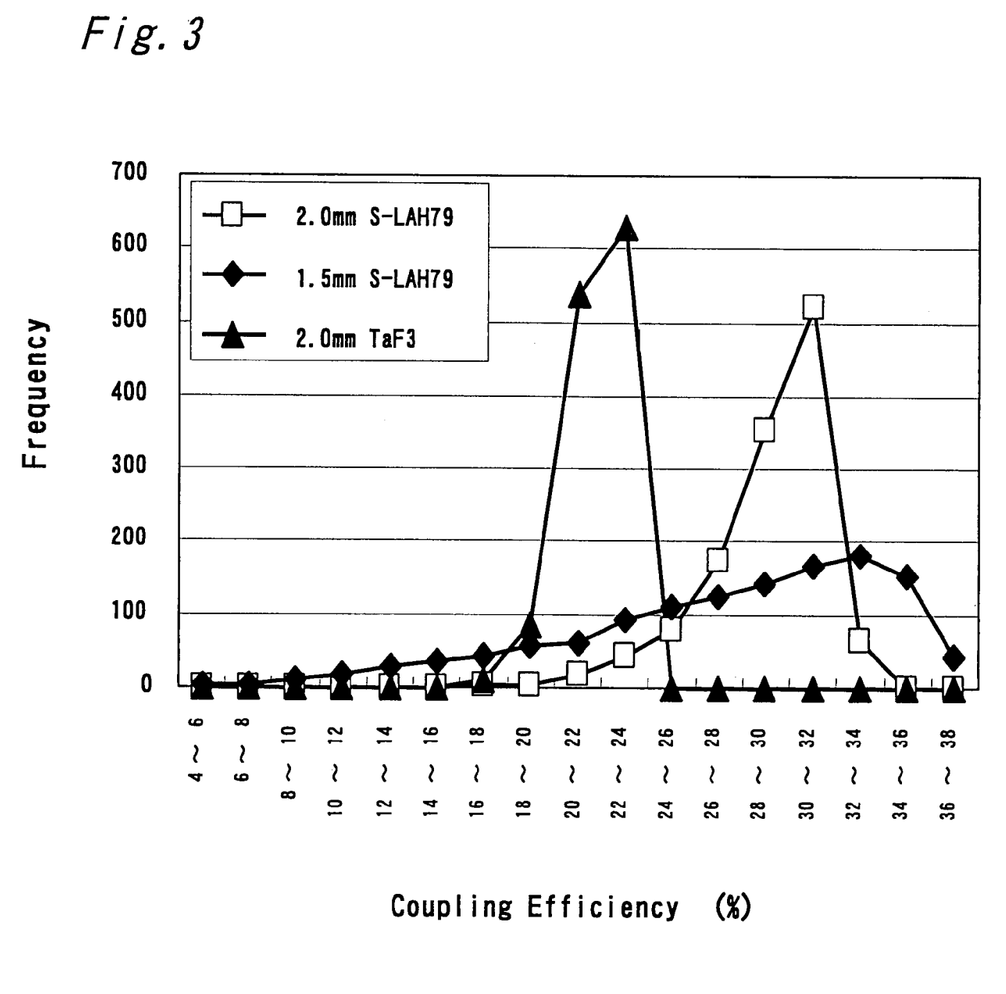
FIG. 3 shows the relationships between coupling efficiency values and their frequencies.

FIG. 3 shows the relationships between coupling efficiency values and their frequencies. It should be noted that the coupling efficiency values in the figure were obtained by assuming that the standard deviation of the displacement of the ball lens with respect to the semiconductor laser diode is 25 μm. The figure indicates that a ball lens having a diameter of 1.5 mm exhibits a higher maximum coupling efficiency than a ball lens having a diameter of 2.0 mm if they are formed of S-LAH79. However, the coupling efficiency of the ball lens having a diameter of 1.5 mm varies more than the coupling efficiency of the ball lens having a diameter of 2.0 mm. The figure also indicates that a ball lens formed of S-LAH79 (having a refractive index of 1.97) exhibits higher coupling efficiency values than a ball lens formed of $TaF_3$ (having a refractive index of 1.78) (as a whole) if they have the same diameter.

Figure 4:
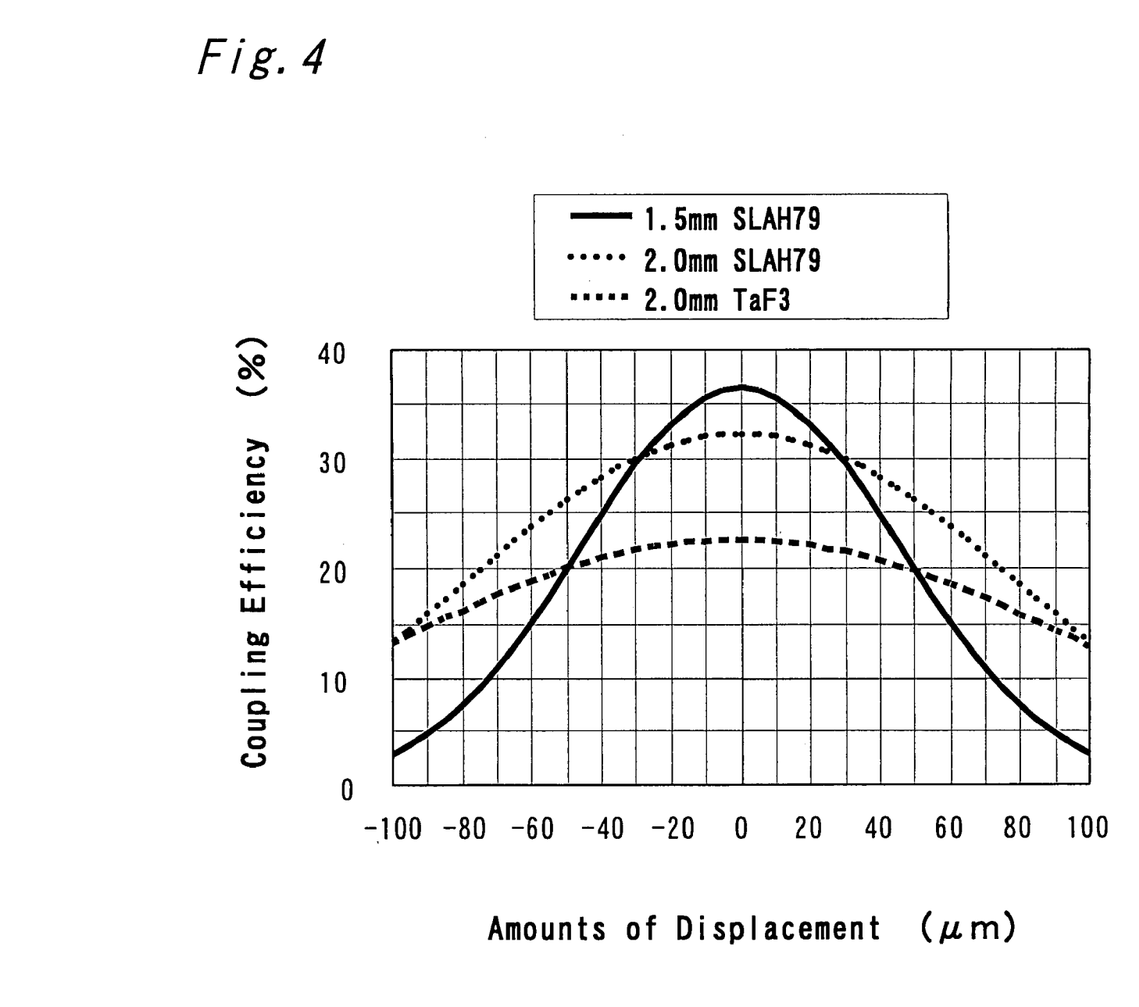
FIG. 4 shows the relationships between the amounts of displacement of ball lenses with respect to the semiconductor laser diode and the coupling efficiencies.

FIG. 4 shows the relationships between the amounts of displacement of ball lenses with respect to the semiconductor laser diode and the coupling efficiencies. The figure indicates that to obtain a given coupling efficiency, a ball lens having a diameter of 1.5 mm requires higher mounting accuracy than a ball lens having a diameter of 2.0 mm if they are formed of S-LAH79. The figure also indicates that a ball lens formed of S-LAH79 (having a refractive index of 1.97) exhibits higher coupling efficiency values than a ball lens formed of $TaF_3$ (having a refractive index of 1.78) if they have the same diameter. Further, to obtain a given coupling efficiency, the latter requires higher mounting accuracy.

Thus, there is a trade-off between maximum coupling efficiency and mounting accuracy. Therefore, when designing a semiconductor device module suitable for mass production, the diameter of the ball lens must be determined by considering this trade-off. The present invention uses a ball lens having a diameter between 1.5 mm and 2.5 mm, which allows it to produce semiconductor device modules having a relatively high coupling efficiency in high yield.

Referring to FIG. 1, the optical fiber 10 may be, for example, a single-mode fiber having a zero dispersion wavelength of 1.3 μm. The optical fiber 10 is adhesively fixed in place by a ferrule 11, which in turn is fixed to a second chassis 13 with a screw 12. Further, the second chassis 13 is fixed to the first chassis 9 by YAG laser welding.

It should be noted that in FIG. 1, reference numeral 14 denotes the path of the beam emitted from the semiconductor laser diode 1. The beam is converged by the ball lens 7 and then introduced to the optical fiber 10.

Figure 5:
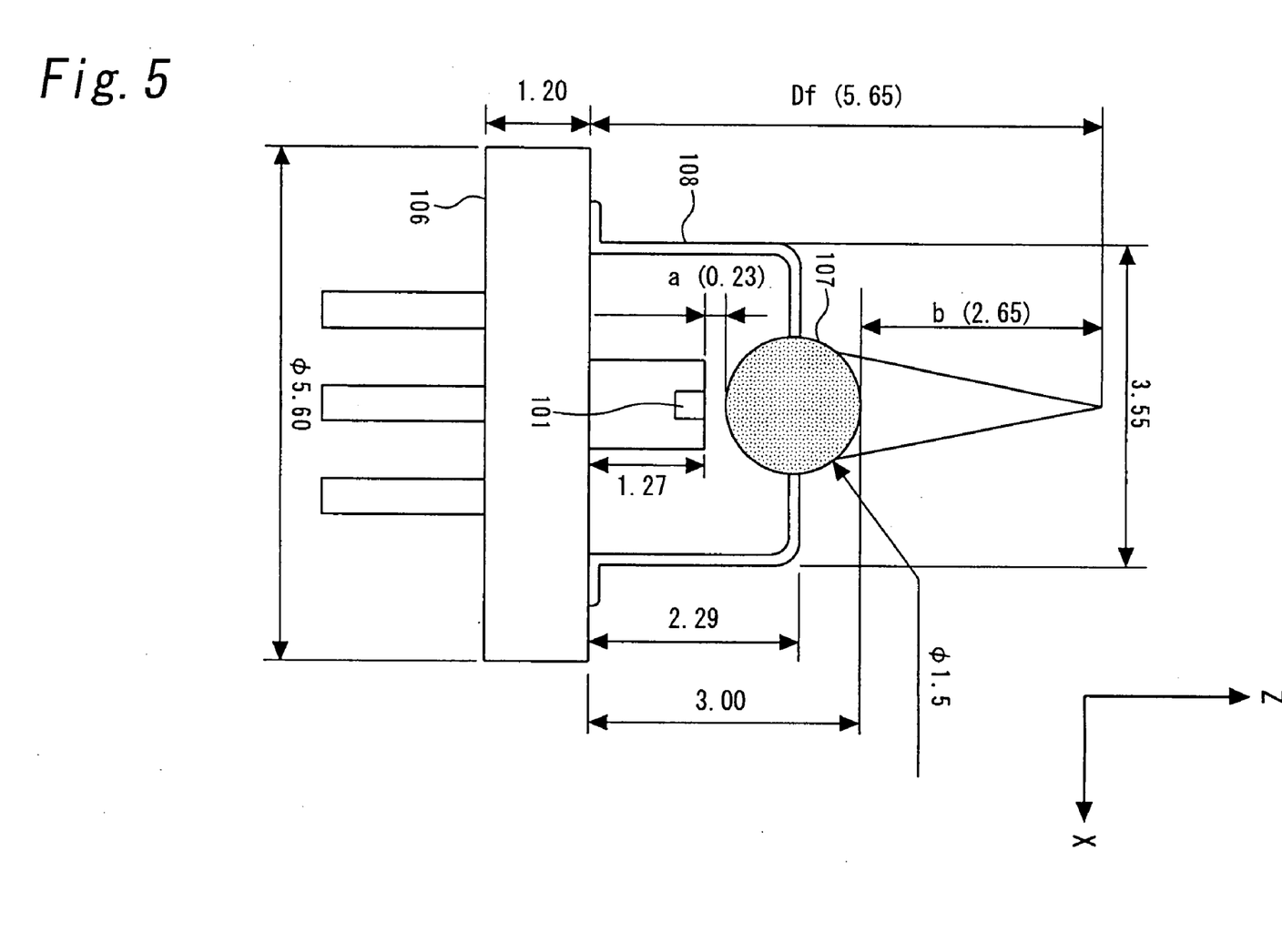
FIG. 5 is an enlarged cross-sectional view of the ball lens portion of an optical semiconductor device module according to the present invention.

FIG. 5 is an enlarged cross-sectional view of the ball lens portion of an optical semiconductor device module such as that shown in FIG. 1.

A ball lens 107 in FIG. 5 is 1.5 mm in diameter and formed of S-LAH79 having a refractive index of 1.97. The distance a between the center of the light entrance surface of the ball lens 107 and the end face of a semiconductor laser diode 101 is 0.23 mm, while the distance Df from the top surface of a stem 106 to the focal point is 5.65 mm. Further, the distance b from the center of the light exit surface of the ball lens 107 to the focal point is 2.65 mm.

Figure 6:
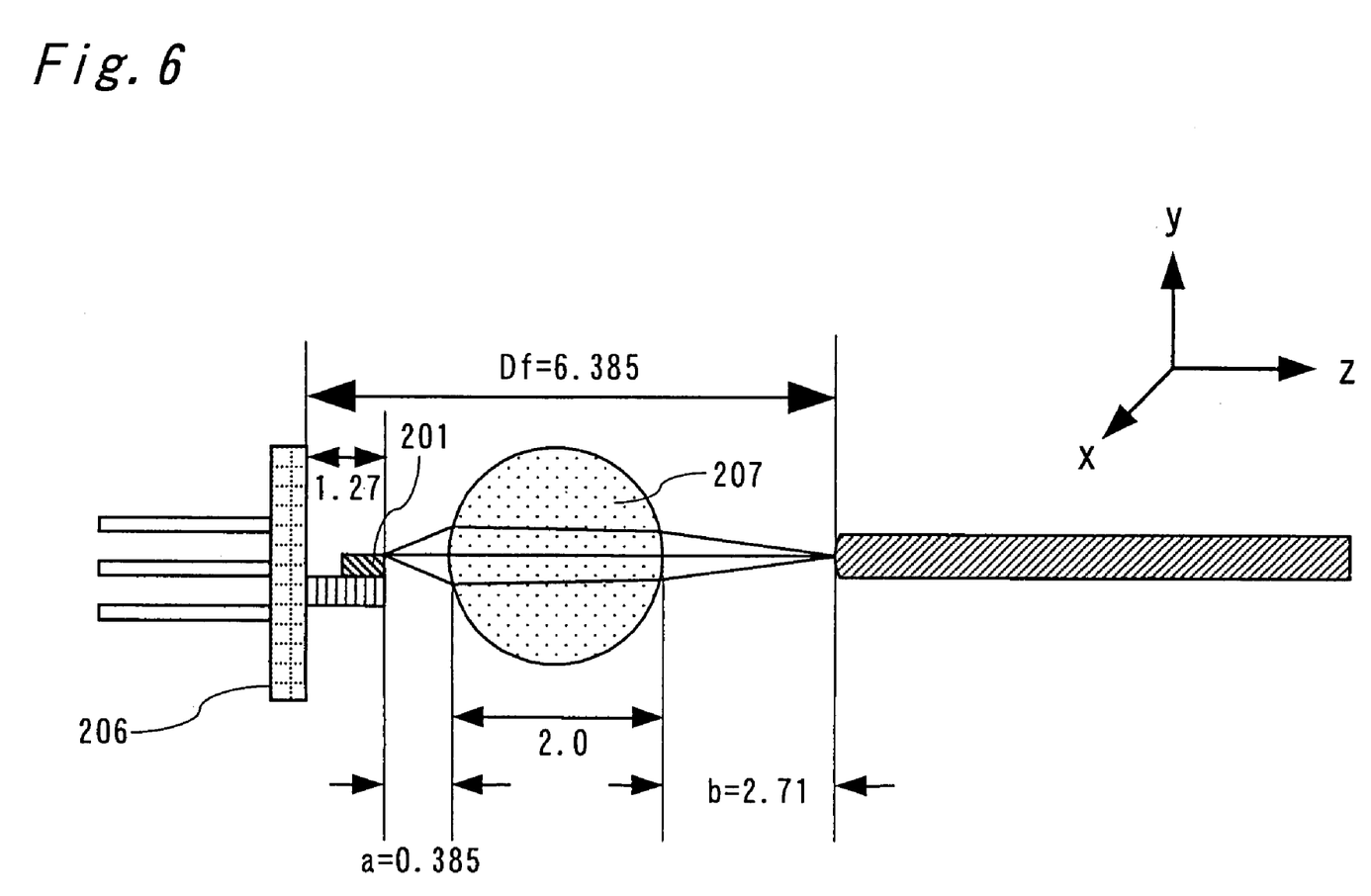
FIG. 6 is an enlarged cross-sectional view of the ball lens portion of another optical semiconductor device module according to the present invention.

FIG. 6 is an enlarged cross-sectional view of the ball lens portion of a semiconductor device module employing a ball lens having a different diameter from the ball lens shown in FIG. 5. It should be noted that the optical semiconductor device module in FIG. 6 also has a configuration similar to that shown in FIG. 1.

Like the ball lens 107 in FIG. 5, a ball lens 207 in FIG. 6 is formed of S-LAH79 having a refractive index of 1.97. However, its diameter is 2.0 mm. The distance a between the center of the light entrance surface of the ball lens 207 and the end face of a semiconductor laser diode 201 is 0.385 mm, while the distance Df from the top surface of a stem 206 to the focal point is 6.365 mm. Further, the distance b from the center of the light exit surface of the ball lens 207 to the focal point is 2.71 mm.

Figure 7:
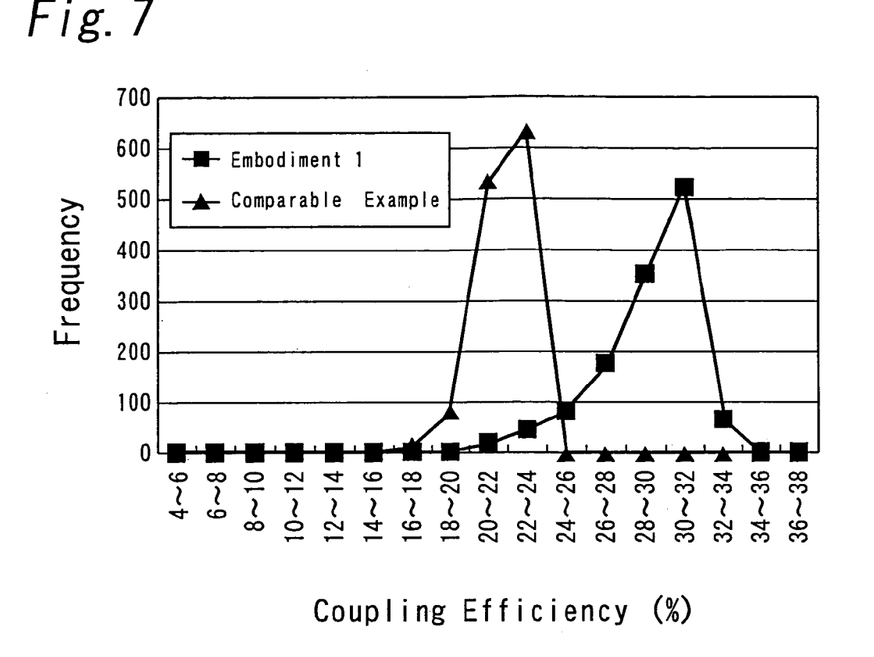
FIG. 7 shows the distribution of values for the coupling efficiency of an optical semiconductor device module according to the present invention.

FIG. 7 shows the distribution of values for the coupling efficiency of an optical semiconductor device module of the present embodiment when the assembling accuracies of the optical semiconductor device and the ball lens are set to 50 μm. For comparison, the figure also shows the distribution of values for the coupling efficiency of a conventional optical semiconductor device module which employs a ball lens having a refractive index of 1.78 and a diameter of 2 mm. As can be seen from the figure, the present embodiment can provide a higher coupling efficiency than the conventional optical semiconductor device module. Specifically, whereas the conventional optical semiconductor device module only provides a coupling efficiency of approximately 25% at most, the present embodiment can provide a coupling efficiency of 25% or more for the following reason.

The present embodiment uses a ball lens having a refractive index of 1.9 or more, which allows the distance between the optical semiconductor device and the ball lens to be reduced, as compared to the conventional optical semiconductor device module. Such an arrangement can reduce the influence of spherical aberration, thereby providing a higher coupling efficiency than the conventional arrangement. For example, when the distance Df is approximately between 4 mm and 10 mm, a ball lens having a refractive index between 1.9 and 3.8 and a diameter between 1.5 mm and 2.5 mm may be set such that it is close to (but not in contact with) the optical semiconductor device to obtain a high coupling efficiency (25% or more).

Figure 8:
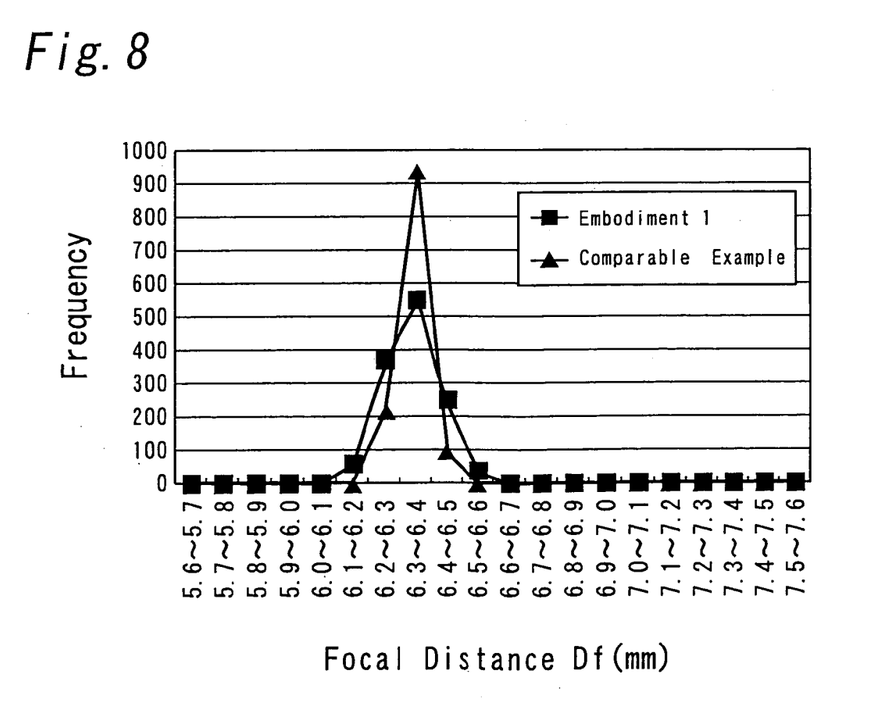
FIG. 8 shows the distribution of values for the focal distance Df of an optical semiconductor device module according to the present invention.

FIG. 8 shows the distribution of values for the focal distance Df of an optical semiconductor device module of the present embodiment when the assembling accuracies of the optical semiconductor device and the ball lens are set to 50 μm. For comparison, the figure also shows the distribution of values for the focal distance Df of a conventional optical semiconductor device module which employs a ball lens having a refractive index of 1.78 and a diameter of 2 mm. In the figure, the distribution of the focal distance Df values according to the present embodiment is not much wider than that of the conventional optical semiconductor device module even though the present embodiment employs a ball lens having a higher refractive index.

Further, according to the present embodiment, the ball lens and the optical fiber are preferably arranged so as to satisfy the relations expressed by equations (1) to (5) below, where: f denotes the focal distance (mm) of the ball lens; n, the refractive index of the ball lens; R, the radius (mm) of the ball lens; a, the distance (mm) from the center of the light entrance surface of the ball lens to the end face of the optical semiconductor device; b, the distance (mm) from the center of the light exit surface of the ball lens to the end face of the optical fiber; and α, a coefficient having a value between 0.85 and 1.0. This makes it possible to provide an optical semiconductor device module capable of more effectively achieving the object of the present invention.

$$f=(nR)/\{2(n-1)\} \tag{1}$$

$$b=\alpha[1/\{(1/f)-1/(a+R)\}-R] \tag{2}$$

$$2\leq\{(b+R-f)/(a+R-f)\}^{1/2}\leq 6 \tag{3}$$

$$a\geq 0 \tag{4, and}$$

$$b\geq 0 \tag{5}$$

According to the present embodiment, preferably $a\geq 0.05$ mm, more preferably $a\geq 0.2$ mm. Setting the distance a to such a value can provide a coupling efficiency which is high and which does not vary much even when the assembling accuracies of the semiconductor device and the ball lens are approximately ±50 μm. Generally, the sum of the distance a and the radius R is preferably set to 20 or more times the assembling accuracy to reduce variations in the coupling efficiency.

Figure 9:
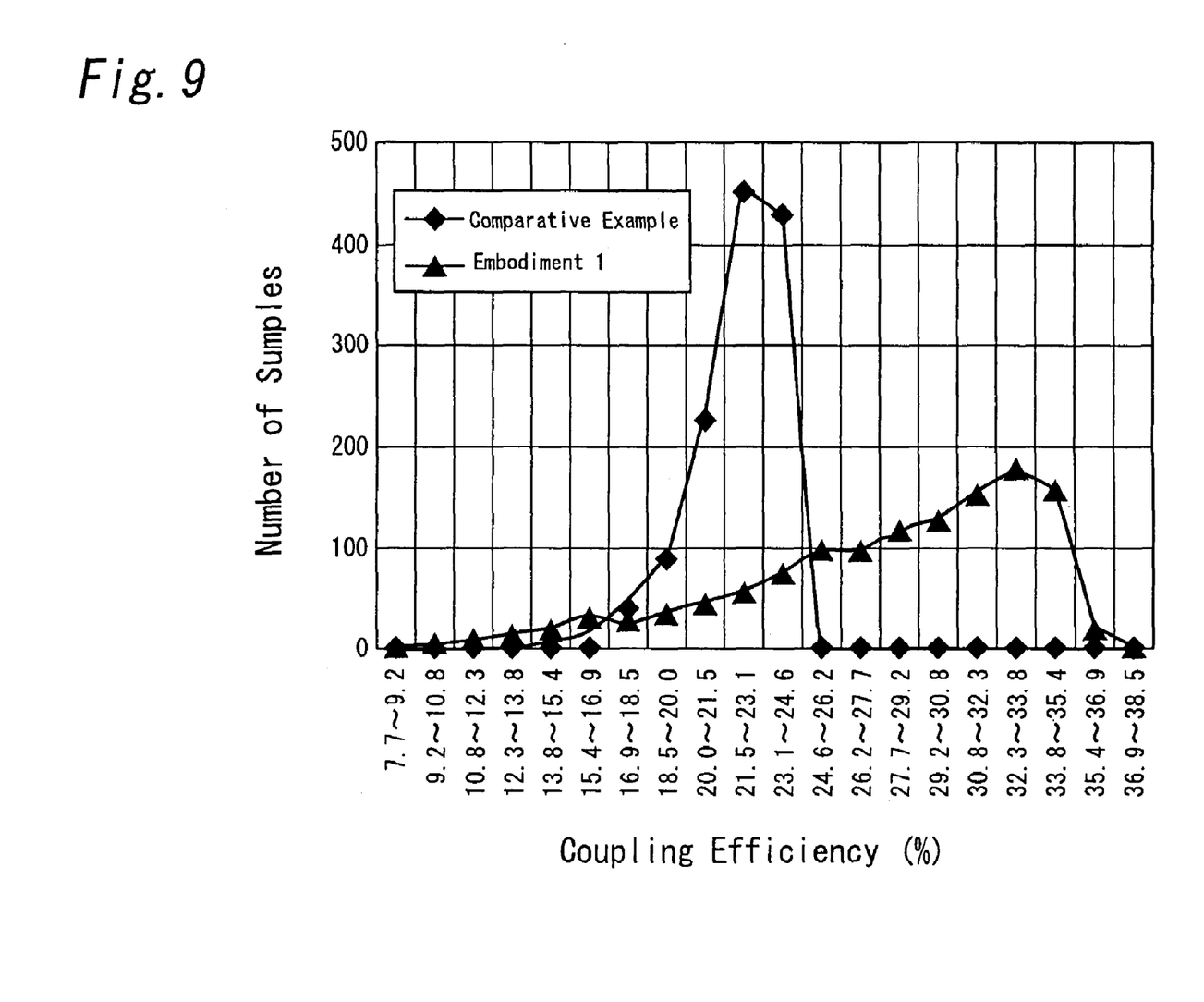
FIG. 9 shows the distribution of calculated values for the coupling efficiency of an optical semiconductor device module according to the present invention.

FIG. 9 shows the distribution of values for the coupling efficiency of an optical semiconductor device module of the present embodiment calculated by assuming that the assembling accuracies of the optical semiconductor device and the ball lens are 50 μm and furthermore the ball lens and the optical fiber are arranged so as to satisfy the relations expressed by equations (1) to (5). In this case, the refractive index n and the diameter of the ball lens are assumed to be 1.97 and 1.5 mm, respectively. Further, the distance a from the center of the light entrance surface of the ball lens to the end face of the optical semiconductor device is assumed to be 0.23 mm. For comparison, the figure also shows the distribution of values for the coupling efficiency of a conventional optical semiconductor device module which employs a ball lens having a refractive index of 1.78 and a diameter of 2 mm. As shown in the figure, the present embodiment can provide a higher coupling efficiency than the conventional arrangement.

Figure 10:
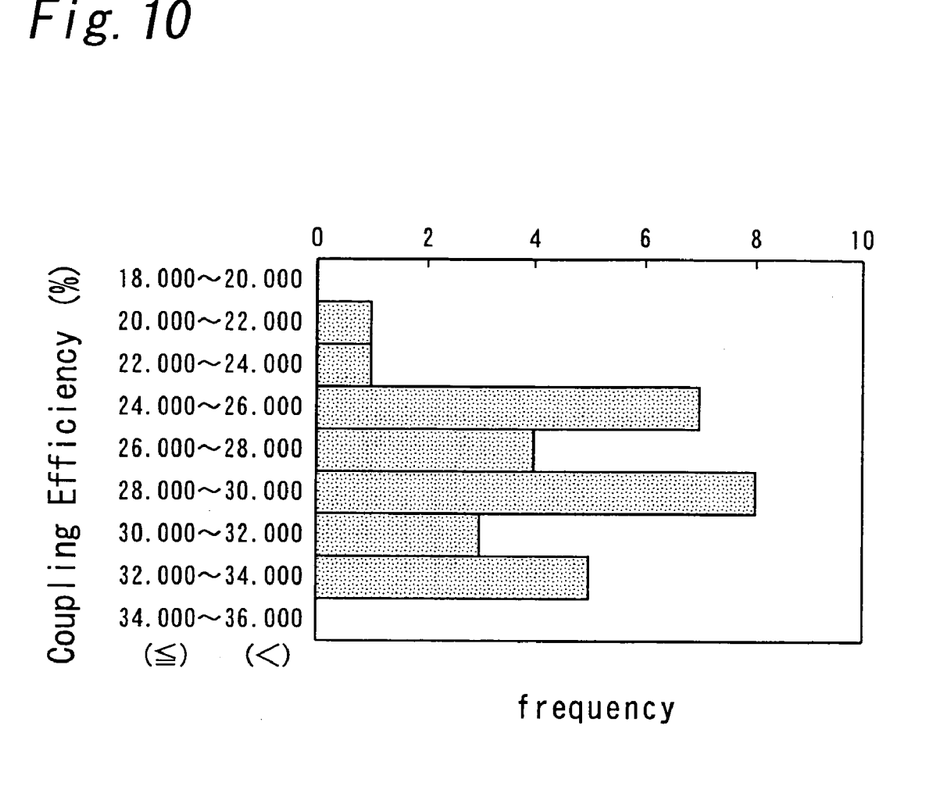
FIG. 10 shows measured coupling efficiencies of optical semiconductor device modules according to the present invention.
Figure 11:
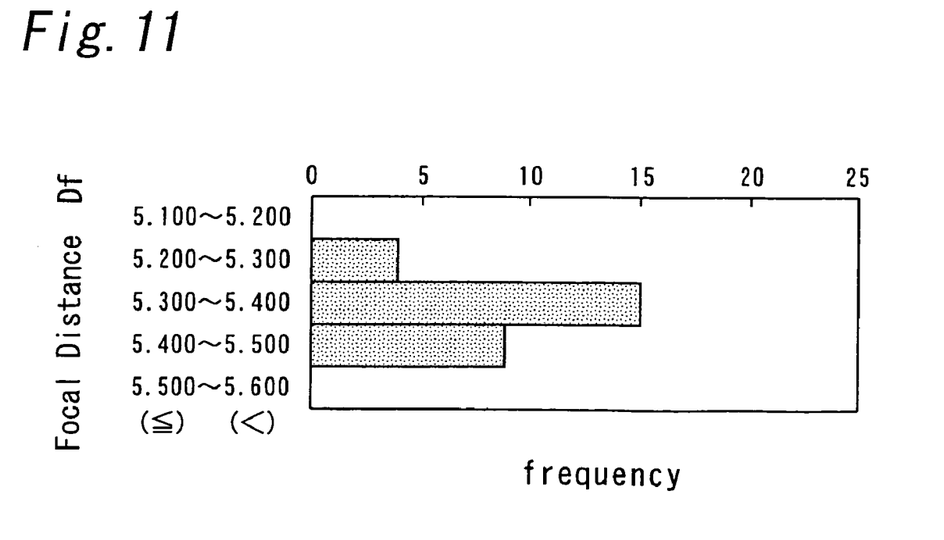
FIG. 11 shows measured focal distances Df of optical semiconductor device modules according to the present invention.

FIGS. 10 and 11 show measured coupling efficiencies and focal distances Df of optical semiconductor device modules of the present embodiment. These figures indicate that the present embodiment can provide a high coupling efficiency (25% or more) without increasing variations in the focal distance Df even when the assembling accuracies of the optical semiconductor device and the ball lens are approximately ±50 μm.

Figure 12:
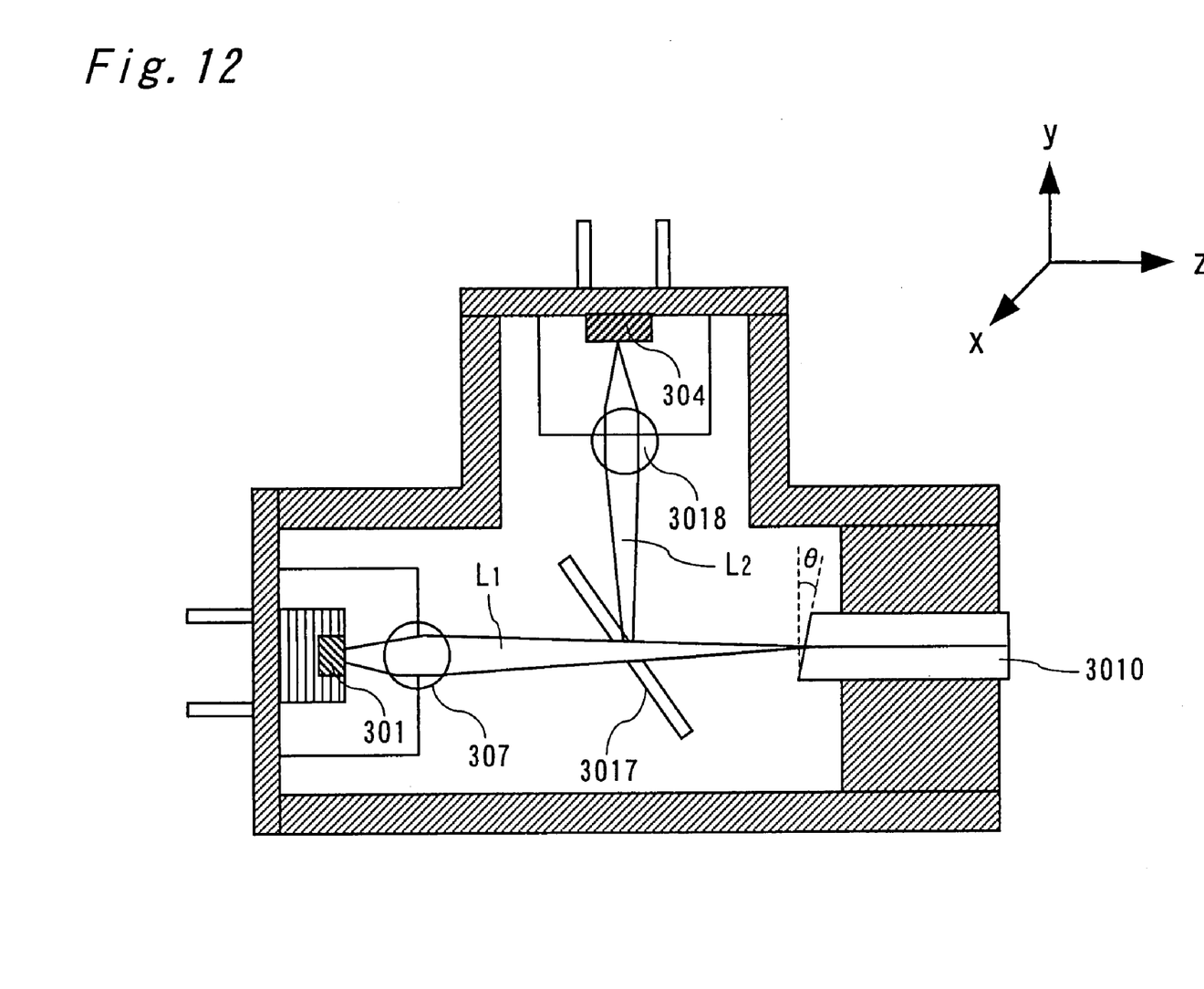
FIG. 12 shows an example in which the present invention is applied to a bidirectional module.

FIG. 12 shows an example in which the present invention is applied to a bidirectional module. This module is an optical semiconductor device module in which a semiconductor laser diode acting as a light emitting device and a semiconductor photodiode acting as a light receiving device are optically coupled to the optical fiber so as to integrate the transmitter and the receiver.

Referring to FIG. 12, the end face of an optical fiber 3010 is at an angle θ of approximately 4 degrees to 20 degrees (preferably 6 degrees to 12 degrees) relative to a direction (the Y direction in the figure) perpendicular to the central axis of the optical fiber 3010. It should be noted that the Z direction in the figure coincides with the central axis of the optical fiber 3010. Further, a semiconductor laser diode 301 is disposed such that it is displaced 20 μm-200 μm in the-y direction (with respect to the optical semiconductor device module shown in FIG. 1). With this arrangement, light $L_1$ transmitted through a ball lens 307 can be introduced to the optical fiber 3010 at an angle of 2 degrees to 9 degrees. This arrangement can produce the same coupling efficiency as the above arrangement (of the ball lens and the semiconductor laser diode). It should be noted that this arrangement causes light $L_2$ emitted from the optical fiber 3010 to enter a semiconductor photodiode 304 at an angle of 2 degrees to 9 degrees. However, the position of the semiconductor photodiode 304 or the angle of a wavelength diffraction filter 3017 may be appropriately adjusted such that the light $L_2$ is efficiently introduced to the light receiving portion of the semiconductor photodiode 304.

The present invention can provide a bidirectional module having a high coupling efficiency by using a ball lens 307 having a refractive index of 1.9 or more and a diameter between 1.5 mm and 2.5 mm. It should be noted that the ball lens 307 and other components are preferably configured so as to satisfy the above equations (1) to (5). It should be further noted that the ball lens 3018 used for the light receiving device may be a ball lens of the present invention, or it may be a conventional ball lens.

As described above, the present invention can provide an optical semiconductor device module and bidirectional module, capable of providing high coupling efficiency at low cost by using a ball lens having a refractive index of 1.9 or more and a diameter between 1.5 mm and 2.5 mm instead of using an aspherical lens or a plurality of lenses.

The features and advantages of the present invention may be summarized as follows.

According to the present invention, the present invention uses a ball lens having a refractive index of 1.9 or more and a diameter between 1.5 mm and 2.5 mm, which allows it to provide an optical semiconductor device module and bidirectional module, capable of providing high coupling efficiency at low cost.

Obviously many modifications and variations of the present invention are possible in the light of the above teachings. It is therefore to be understood that within the scope of the appended claims the invention may be practiced otherwise than as specifically described.

The entire disclosure of Japanese Patent Applications No. 2004-171587, filed on Jun. 9, 2004 including specification, claims, drawings and summary, on which the Convention priority of the present application is based, are incorporated herein by reference in their entirety.

What is claimed is:

1. An optical semiconductor device module comprising:
   an optical semiconductor device emitting light and having a light-emitting end face optically coupled to an optical fiber;
   a stem on which said optical semiconductor device is mounted;
   a cap fixed to said stem, said cap having a light transmissive hole between the optical fiber and said optical semiconductor device; and
   a ball lens fixed in said light transmissive hole, wherein
   said ball lens has a light-entrance surface opposite and facing said optical semiconductor device and through which light emitted from said optical semiconductor device enters said ball lens and a light-exit surface opposite the light-entrance surface and through which the light exits said ball lens,
   said ball lens has a refractive index of at least 1.9 and a diameter between 1.5 mm and 2.5 mm, and
   minimum distance between the light-entrance surface of said ball lens and the light-emitting end face of said optical semiconductor device is at least 0.2 mm.

2. The optical semiconductor device module according to claim 1, wherein said optical semiconductor device is a semiconductor laser diode.

3. The optical semiconductor device module according to claim 1, wherein said ball lens is disposed with respect to said optical fiber to satisfy the following equations:

$$f=(nR)/\{2(n-1)\},$$

$$b=\alpha[1/\{(1/f)-1/(a+R)\}-R],$$

$$2<\{(b+R-f)/(a+R-f)\}^{1/2}<6, \text{ and}$$

$$b>0,$$

where:
   f is focal distance (mm) of said ball lens;
   n is the refractive index of said ball lens;
   R is radius (mm) of said ball lens;
   a is the minimum distance (mm) between the light-entrance surface of said ball lens and the light-emitting end face of said optical semiconductor device;
   b is minimum distance (mm) between the light-exit surface of said ball lens and the end face of the optical fiber; and
   α is a coefficient having a value between 0.85 and 1.0.

4. The optical semiconductor device module according to claim 3, wherein said optical semiconductor device is a semiconductor laser diode.

5. A bidirectional module comprising:
   a semiconductor laser diode emitting light from a light-emitting end face;
   a semiconductor photodiode detecting the light emitted by said semiconductor laser diode;
   an optical fiber to which said semiconductor laser diode and said semiconductor photo diode are optically coupled;
   a stem on which said semiconductor laser diode is mounted;
   a cap fixed to said stem, said cap having a light transmissive hole between said optical fiber and said semiconductor laser diode; and
   a ball lens fixed in said light transmissive hole, wherein
      an end face of said optical fiber forms an angle between 4 degrees and 20 degrees relative to a direction perpendicular to a central axis of said optical fiber,
      said ball lens has a light-entrance surface opposite and facing said semiconductor laser diode and through which light emitted from said semiconductor laser diode enters said ball lens, and a light-exit surface opposite the light-entrance surface and through which the light exits said ball lens, and
      said ball lens has a refractive index of at least 1.9 and a diameter between 1.5 mm and 2.5 mm.

6. The bidirectional module according to claim 5, wherein said ball lens is disposed with respect to said optical fiber to satisfy the following equations:

$f=(nR)/\{2(n-1)\}$, $b=\alpha[1/\{(1/f)-1/(a+R)\}-R]$, $2<\{(b+R-f)/(a+R-f)\}^{1/2}<6$, and $a>0$, and $b>0$, where:
   f is focal distance (mm) of said ball lens;
   n is the refractive index of said ball lens;
   R is radius (mm) of said ball lens;
   a is minimum distance (mm) between the light-entrance surface of said ball lens and the light-emitting end face of said optical semiconductor device;
   b is minimum distance (mm) between the light-exit surface of said ball lens and the end face of said optical fiber; and
   α is a coefficient having a value between 0.85 and 1.0.

7. A bidirectional module comprising:
   a semiconductor laser diode emitting light from a light-emitting end face;
   a semiconductor photodiode detecting the light emitted by said semiconductor laser diode;
   an optical fiber to which said semiconductor laser diode and said semiconductor photodiode are optically coupled;
   a stem on which said semiconductor laser diode is mounted;
   a cap fixed to said stem, said cap having a light transmissive hole between said optical fiber and said semiconductor laser diode; and
   a ball lens fixed in said light transmissive hole, wherein
      an end face of said optical fiber forms an angle between 4 degrees and 20 degrees relative to a direction perpendicular to a central axis of said optical fiber,
      said ball lens has a light-entrance surface opposite and facing said semiconductor laser diode and through which light emitted from said semiconductor laser diode enters said ball lens, and a light-exit surface opposite the light-entrance surface and through which the light exits said ball lens,
      said ball lens has a refractive index of at least 1.9 and a diameter between 1.5 mm and 2.5 mm, and
      minimum distance between the light-entrance surface of said ball lens and the light-emitting end face of said optical semiconductor device is at least 0.2 mm.

8. The optical semiconductor device module according to claim 7, wherein said ball lens is disposed with respect to said optical fiber to satisfy the following equations:

$f=(nR)/\{2(n-1)\}$, $b=\alpha[1/\{(1/f)-1/(a+R)\}-R]$, $2<\{(b+R-f)/(a+R-f)\}^{1/2}<6$, and $b>0$, where:
   f is focal distance (mm) of said ball lens;
   n is the refractive index of said ball lens;
   R is radius (mm) of said ball lens;
   a is the minimum distance (mm) between the light-entrance surface of said ball lens and the light-emitting end face of said optical semiconductor device;
   b is minimum distance (mm) between the light-exit surface of said ball lens and the end face of the optical fiber; and
   α is a coefficient having a value between 0.85 and 1.0.

* * * * *